United States Patent
Kunnathur Ragupathi et al.

(10) Patent No.: US 9,974,210 B2
(45) Date of Patent: May 15, 2018

(54) SYSTEMS AND METHODS OF REAL TIME OPTIMUM AIRFLOW BALANCING ON RACK LEVEL AIRFLOW CONSTRAINT

(71) Applicant: Dell Products L.P., Round Rock, TX (US)

(72) Inventors: Dinesh Kunnathur Ragupathi, Round Rock, TX (US); Hasnain Shabbir, Round Rock, TX (US); Dominick Adam Lovicott, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 17 days.

(21) Appl. No.: 15/138,584

(22) Filed: Apr. 26, 2016

(65) Prior Publication Data

US 2017/0311477 A1 Oct. 26, 2017

(51) Int. Cl.
*H05K 7/20* (2006.01)

(52) U.S. Cl.
CPC ......... *H05K 7/207* (2013.01); *H05K 7/20736* (2013.01); *H05K 7/20818* (2013.01)

(58) Field of Classification Search
None
See application file for complete search history.

(56) References Cited

U.S. PATENT DOCUMENTS

| | | |
|---|---|---|
| 2009/0099696 A1 | 4/2009 | Artman et al. |
| 2014/0076451 A1 | 3/2014 | Felix-Henry et al. |
| 2015/0253029 A1 | 9/2015 | Palmer et al. |
| 2015/0253794 A1 | 9/2015 | Palmer et al. |
| 2015/0253821 A1 | 9/2015 | Palmer et al. |
| 2016/0037686 A1 | 2/2016 | Shabbir et al. |

OTHER PUBLICATIONS

U.S. Appl. No. 14/621,146, filed Feb. 12, 2015, 42 page.

*Primary Examiner* — Carlos Ortiz Rodriguez
(74) *Attorney, Agent, or Firm* — Baker Botts L.L.P.

(57) ABSTRACT

A central information management console provides for real time management of airflow across an information handling system or across multiple information handling systems within one or multiple racks within an environment by estimating and prioritizing the volumetric airflow needs of each information handling system within the environment. Each information handling system or group of information handling systems may be given a priority setting based on one or more criteria and volumetric airflow may be provided based on the priority setting and a selected balancing option. Metrics and sensor readings are received by the central information management console in real time or at intervals to use in determining the amount of volumetric airflow to provide to each information handling system so as to balance volumetric airflow for efficient operation of the environment and to maintain volumetric airflow so as not to exceed a volumetric airflow limit.

20 Claims, 3 Drawing Sheets

SYSTEMS AND METHODS OF REAL TIME OPTIMUM AIRFLOW BALANCING ON RACK LEVEL AIRFLOW CONSTRAINT

TECHNICAL FIELD

This disclosure relates generally to regulating airflow in information handling systems and more particularly to automatic real time optimum volumetric airflow balancing based on rack level airflow constraint of information handling systems within a rack environment.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may process, store, and communicate information and may include one or more computer systems, data storage systems, and networking systems.

In various information handling systems, the information handling system may cool or otherwise regulate a temperature of itself and its components. One or more fans may be used to help cool the information handling system by providing airflow to the information handling system and the components therein.

In certain environments, for example, data centers, cooling of information handling systems is a key concern. More and more information handling systems, such as servers, are installed in an environment without increasing the footprint of the environment. For air-cooled rack based installations of information handling systems, providing adequate airflow to the racks housing the information handling systems is an important criteria in the design and maintenance of the installations for a given environment. The design of such installations must consider maximizing the utilization of the available space within the installation environment to decrease costs while supplying efficient and sufficient airflow.

A need exists to automatically balance the airflow in an environment with installed information handling systems.

SUMMARY

In particular embodiments, a method for regulating volumetric airflow in an environment, comprises receiving a volumetric airflow limit for a rack within the environment, wherein the rack comprises one or more information handling systems; receiving one or more balancing options, wherein the one or more balancing options comprise at least one of volumetric airflow sensitivity, equal allocation of volumetric airflow limits, priority based, at least in part, on configurable power range, volumetric airflow scaling based on type of workload, and allocation of volumetric airflow based on a priority setting; receiving one or more sensor readings from one or more sensors associated with the rack; receiving one or more metrics from the one or more information handling systems, wherein a fan is associated with each of the one or more information handling systems; prioritizing each of the one or more information handling systems based, at least in part, on the received one or more balancing options; and balancing volumetric airflow automatically for the rack, wherein the balancing is based, at least in part, on the prioritization and the received one or more balancing options, and wherein the balancing maintains volumetric airflow within the rack within the volumetric airflow limit.

In other embodiments, when the balancing option is volumetric airflow sensitivity then the method further comprises receiving a volumetric airflow sensitivity reading from the one or more sensors for the one or more information handling systems; prioritizing the one or more information handling systems based, at least in part, on the volumetric airflow sensitivity reading associated with each of the one or more information handling systems; determining which of the one or more information handling systems has the highest priority; and balancing volumetric airflow to the rack by sending one or more instructions to increase power to a fan associated with an information handling system determined to have the highest priority, wherein the increase in power to the fan associated with an information handling system determined to have the highest priority is balanced across the one or more information handling systems so that overall airflow to the rack does not exceed the volumetric airflow limit.

In other embodiments, if the balancing option is equal allocation of volumetric airflow limits then the method further comprises receiving a volumetric airflow value for each of the one or more information handling systems; aggregating the received volumetric airflow value associated with each of the one or more information handling systems as a total volumetric airflow; determining a difference between the volumetric airflow limit and the total volumetric airflow; and allocating equally the difference across each of the one or more information handling systems, wherein allocating the difference comprises reducing power supplied to each fan associated with the one or more information handling systems; and instructing the one or more information handling systems to implement one or more associated power capping policies.

In other embodiments when the balancing option is priority based on configurable power range then the method further comprises determining a configurable power range for each of the one or more information handling system; allocating a configurable power based priority for each of the one or more information handling systems based, at least in part, on the configurable power range associated with each of the one or more information handling systems; and allocating volumetric airflow based, at least in part, on the allocated configurable power based priority.

In other embodiments when the balancing option balancing option is volumetric scaling based on type of workload then the method further comprises receiving a type of workload associated with each of the one or more information handling systems; ranking each type of workload; and allocating a greater volumetric airflow to at least a first one of the one or more information handling systems than at least a second one of the one or more information handling systems based, at least in part, on the ranking of the type of workload associated with each of the at least a first one of the one or more information handling systems and the at least a second one of the one or more information handling systems.

In other embodiments, when the balancing option is allocation of volumetric airflow based on a priority setting then the method further comprises assigning the one or more information handling systems a priority level, wherein the priority level is based, at least in part, on one or more criteria; grouping the one or more information handling systems based on the priority level associated with each of the one or more information handling systems; receiving a volumetric airflow value for each of the one or more information handling systems; aggregating the received volumetric airflow value associated with each of the one or more information handling systems as a total volumetric airflow; determining a difference between the volumetric airflow limit and the total volumetric airflow; reducing power to each fan associated with each information handling system in a lower priority group; and implementing one or more power capping policies at the each information handling system in the lower priority group.

In other embodiments, power to a fan associated with a lower priority information handling system is decreased when power is increased to a fan associated with an information handling system determined to have the highest priority to maintain volumetric airflow across the rack that does not exceed the volumetric airflow limit.

In other embodiments, a system comprises a first information handling system that comprises one or more central processing units for processing information of the information handling system and a memory communicatively coupled to the one or more central processing units and one or more modules that comprise instructions stored in the memory, the instructions, when executed by the one or more processing units, operable to perform operations comprising any one or more disclosed embodiments.

In other embodiments, one or more computer-readable non-transitory storage media embodying software operable when executed by one or more computer systems to perform any one or more disclosed embodiments.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION

Figure 1:
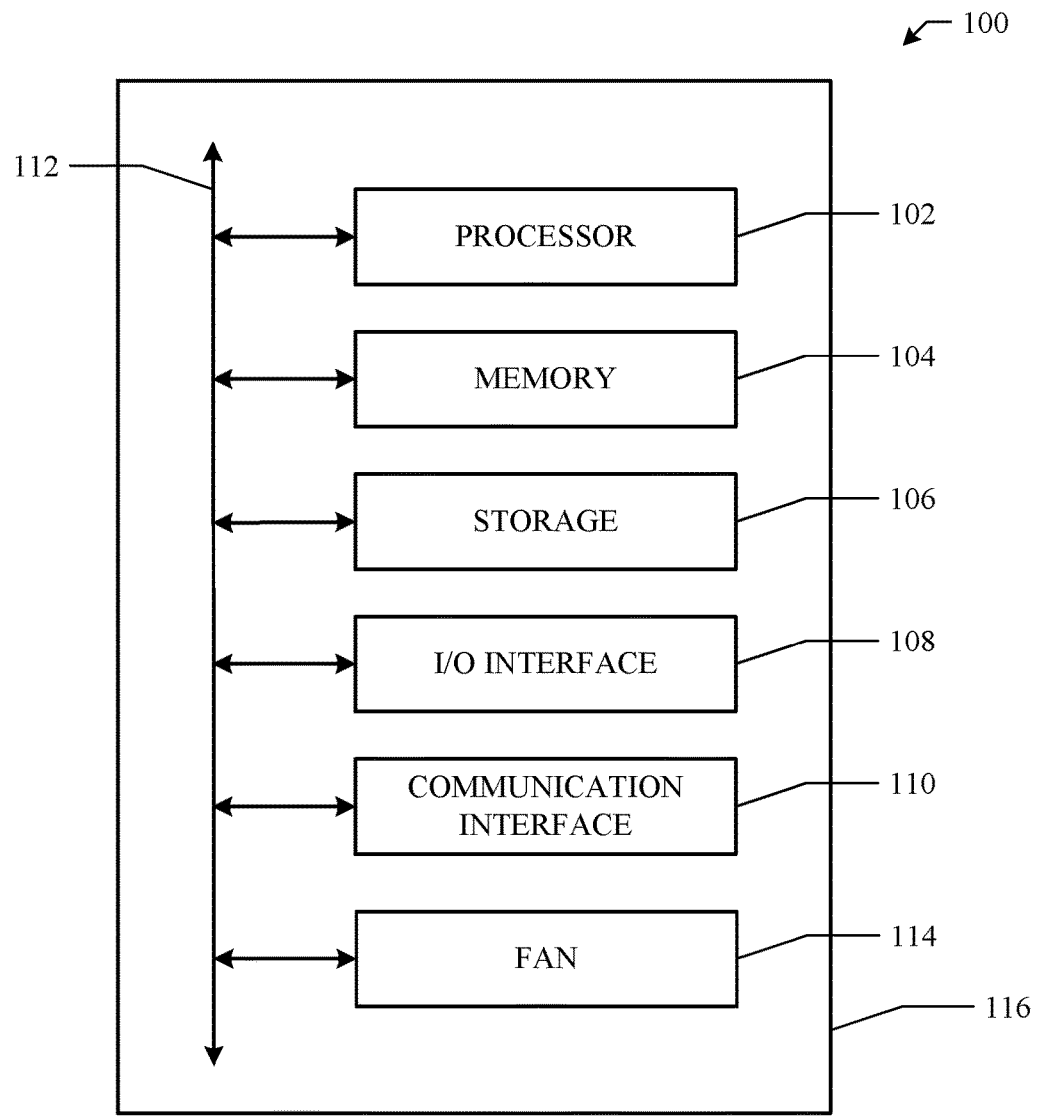
FIG. 1 is a block diagram of selected elements of an information handling system according to one or more embodiments of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a reference numeral followed by an alphabetical character refers to a specific instance of an element and the reference numeral alone refers to the element generically or collectively. Thus, as an example (not shown in the drawings), widget "12*a*" refers to an instance of a widget class, which may be referred to collectively as widgets "12" and any one of which may be referred to generically as a widget "12". In the figures and the description, like numerals are intended to represent like elements.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a PDA, a console, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Additionally, the information handling system may include firmware for controlling and/or communicating with, for example, hard drives, network circuitry, memory devices, I/O devices, and other peripheral devices. As used in this disclosure, firmware includes software embedded in an information handling system component used to perform predefined tasks. Firmware is commonly stored in non-volatile memory, or memory that does not lose stored data upon the loss of power. In certain embodiments, firmware associated with an information handling system component is stored in non-volatile memory that is accessible to one or more information handling system components. In the same or alternative embodiments, firmware associated with an information handling system component is stored in non-volatile memory that is dedicated to and comprises part of that component.

Herein, a computer-readable non-transitory storage medium or media may include one or more instrumentalities or aggregation of instrumentalities that may retain data and/or instructions for a period of time including, but not limited to, semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In certain environments, installation of additional information handling systems is limited by inadequate airflow availability. For example, rack level airflow may not permit additional information handling systems to be installed in an existing rack or a new rack. Further, balancing airflow for such environments is an issue where such must be performed manually. A need exists to automate the balancing of airflow in an environment based on consumption by the given configuration or installation of information handling systems. Volumetric airflow requirements may be approximated and this information may be used along with regulation of fan speed to provide specific volumetric airflow rate to each information handling system. For example, volumetric airflow rate may be measured using any unit of measurement including, but not limited to, cubic feet per minute (CFM), cubic meter per second, or any other unit of measurement known to one of ordinary skill in the art. By allowing automated volumetric airflow balancing, the number of information handling systems within an environment may be maximized while assuring that cooling requirements will be met with minimal performance impacts.

Figure 2:
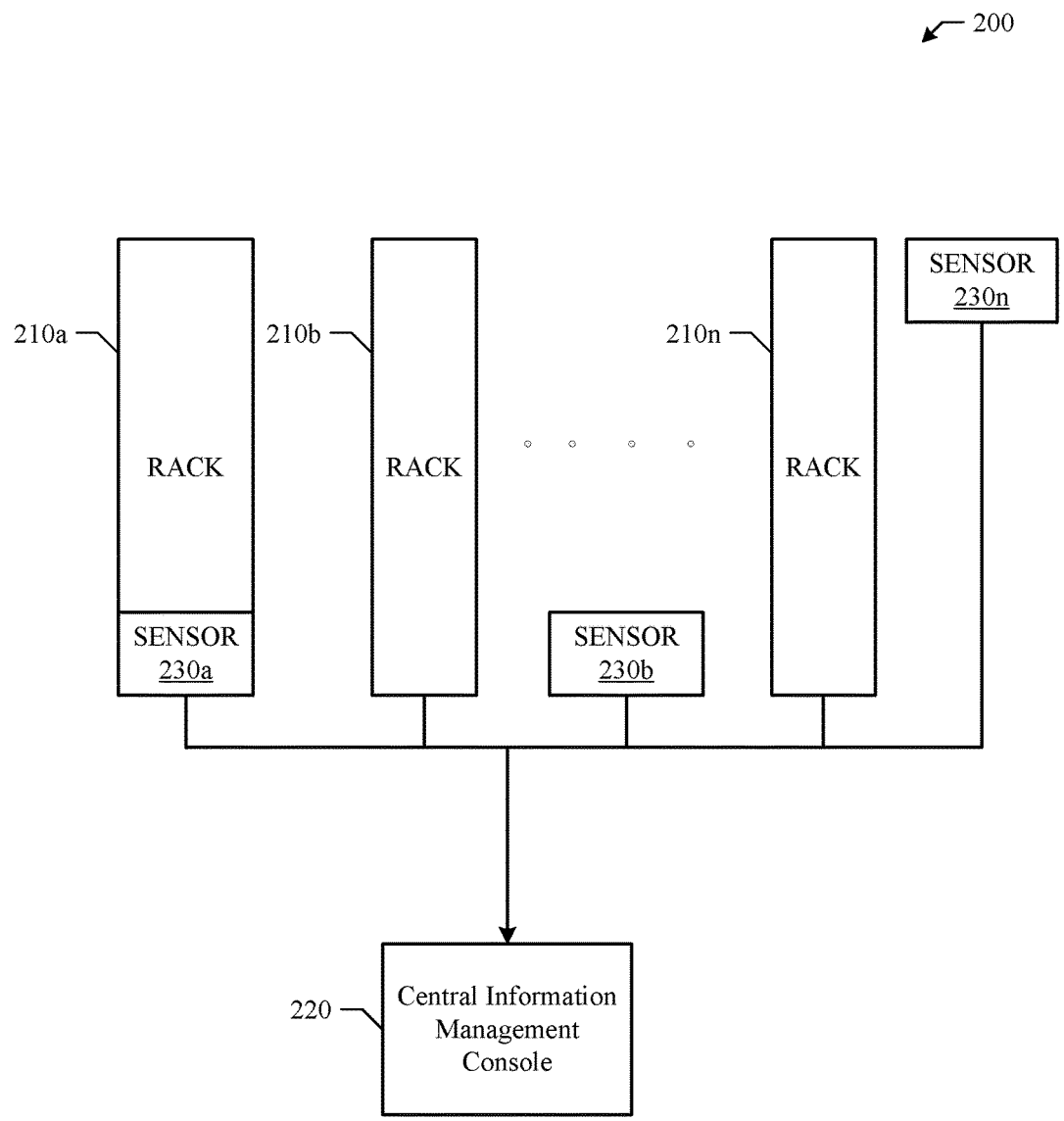
FIG. 2 is a block diagram of selected elements for an environment of racks of information handling systems according to one or more embodiments of the present disclosure.
Figure 3:
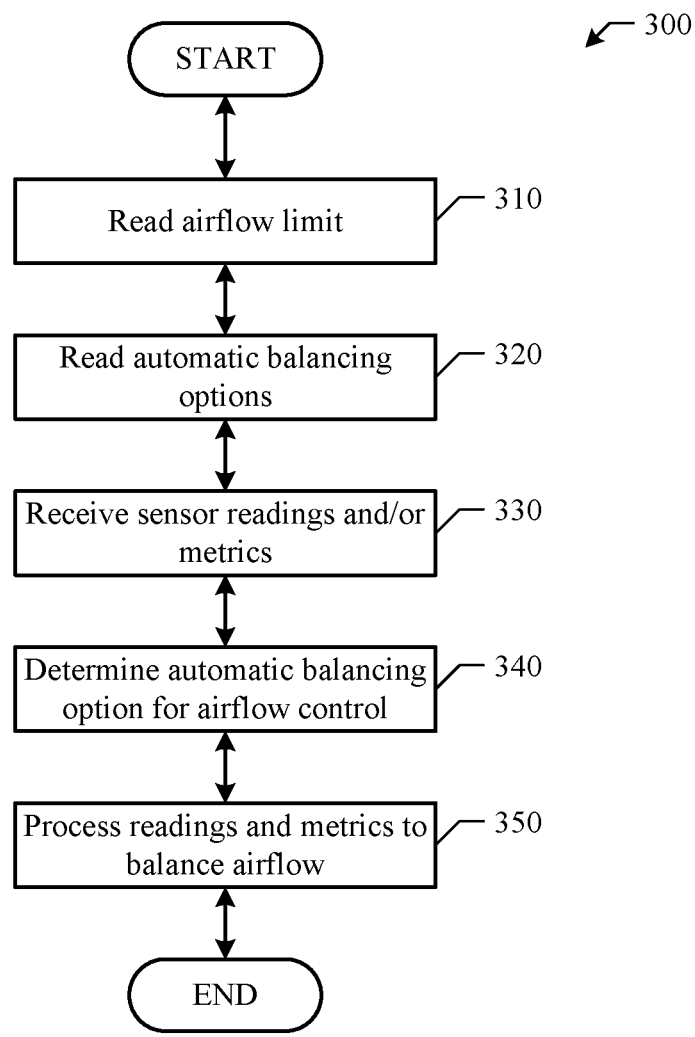
FIG. 3 is a flowchart for a method for one or more embodiments according to the present disclosure.

Particular embodiments are best understood by reference to FIGS. 1-3 wherein like numbers are used to indicate like and corresponding parts.

FIG. 1 illustrates an example information handling system 100. In particular embodiments, one or more information handling systems 100 perform one or more steps of one or more methods described or illustrated herein. In particular embodiments, one or more information handling systems 100 provide functionality described or illustrated herein. In particular embodiments, software running on one or more information handling systems 100 performs one or more steps of one or more methods described or illustrated herein or provides functionality described or illustrated herein. Particular embodiments include one or more portions of one or more information handling systems 100. Herein, reference to an information handling system may encompass a computing device, and vice versa, where appropriate. Moreover, reference to an information handling system may encompass one or more information handling systems, where appropriate.

This disclosure contemplates any suitable number of information handling systems 100 arranged in any configuration within any environment. In certain embodiments, information handling system 110 may be included in a rack domain. In certain embodiments, each information handling system 110 may be contained within a suitable enclosure, for example, a chassis 116 where the chassis 116 may include a front panel (not shown) and a back panel (not shown). In other embodiments, information handling system 100 is not contained within chassis 116. This disclosure contemplates information handling system 100 taking any suitable physical form. As an example and not by way of limitation, information handling system 100 may be an embedded information handling system, a system-on-chip (SOC), a single-board information handling system (SBC) (such as, for example, a computer-on-module (COM) or system-on-module (SOM)), a desktop information handling system, a laptop or notebook information handling system, an interactive kiosk, a mainframe, a mesh of information handling systems, a console, a mobile telephone, a personal digital assistant (PDA), a server, a tablet information handling system, or a combination of two or more of these. Where appropriate, information handling system 100 may include one or more information handling systems 100; be unitary or distributed; span multiple locations; span multiple machines; span multiple data centers; or reside in a cloud, which may include one or more cloud components in one or more networks. Where appropriate, one or more information handling systems 100 may perform without substantial spatial or temporal limitation one or more steps of one or more methods described or illustrated herein. As an example and not by way of limitation, one or more information handling systems 100 may perform in real time or in batch mode one or more steps of one or more methods described or illustrated herein. One or more information handling systems 100 may perform at different times or at different locations one or more steps of one or more methods described or illustrated herein, where appropriate.

In particular embodiments, information handling system 100 includes a processor 102, memory 104, storage 106, an input/output (I/O) interface 108, a communication interface 110, a bus 112, and a fan 114. Although this disclosure describes and illustrates a particular information handling system having a particular number of particular components in a particular arrangement, this disclosure contemplates any suitable information handling system having any suitable number of any suitable components in any suitable arrangement.

In particular embodiments, processor 102 may comprise one or more processors. In certain embodiments, processor 102 may include a microprocessor, microcontroller, digital signal processor (DSP), ASIC, or another digital or analog circuitry configured to interpret and/or execute program instructions and/or process data. In particular embodiments, processor 102 includes hardware for executing instructions, such as those making up a computer program. A computer program may be software, firmware or any combination thereof. As an example and not by way of limitation, to execute instructions, processor 102 may retrieve (or fetch) the instructions from an internal register, an internal cache, memory 104, or storage 106; decode and execute them; and then write one or more results to an internal register, an internal cache, memory 104, or storage 106. In particular embodiments, processor 102 may include one or more internal caches for data, instructions, or addresses. This disclosure contemplates processor 102 including any suitable number of any suitable internal caches, where appropriate. As an example and not by way of limitation, processor 102 may include one or more instruction caches, one or more data caches, and one or more translation lookaside buffers (TLBs). Instructions in the instruction caches may be copies of instructions in memory 104 or storage 106, and the instruction caches may speed up retrieval of those instructions by processor 102. Data in the data caches may be copies of data in memory 104 or storage 106 for instructions executing at processor 102 to operate on; the results of previous instructions executed at processor 102 for access by subsequent instructions executing at processor 102 or for writing to memory 104 or storage 106; or other suitable data. The data caches may speed up read or write operations by processor 102. The TLBs may speed up virtual-address translation for processor 102. In particular embodiments, processor 102 may include one or more internal registers for data, instructions, or addresses. This disclosure contemplates processor 102 including any suitable number of any suitable internal registers, where appropriate. Where appropriate, processor 102 may include one or more arithmetic logic units (ALUs); be a multi-core processor; or include one or more processors 102. Although this disclosure describes and illustrates a particular processor, this disclosure contemplates any suitable processor.

In particular embodiments, memory 104 includes main memory for storing instructions for processor 102 to execute or data for processor 102 to operate on. As an example and not by way of limitation, information handling system 100 may load instructions from storage 106 or another source (such as, for example, another information handling system 100) to memory 104. Processor 102 may then load the instructions from memory 104 to an internal register or internal cache. To execute the instructions, processor 102 may retrieve the instructions from the internal register or internal cache and decode them. During or after execution of the instructions, processor 102 may write one or more results (which may be intermediate or final results) to the internal register or internal cache. Processor 102 may then write one or more of those results to memory 104. In particular embodiments, processor 102 executes only instructions in one or more internal registers or internal caches or in memory 104 (as opposed to storage 106 or elsewhere) and operates only on data in one or more internal registers or internal caches or in memory 104 (as opposed to storage 106 or elsewhere). One or more memory buses (which may each include an address bus and a data bus) may couple processor 102 to memory 104. Bus 112 may represent a variety of suitable types of bus structures, for example, a memory bus, a peripheral bus, or a local bus using various bus architectures in selected embodiments. In particular embodiments, one or more memory management units (MMUs) reside between processor 102 and memory 104 and facilitate accesses to memory 104 requested by processor 102. In particular embodiments, memory 104 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 104 may include one or more memories 104, where appropriate. Although this disclosure describes and illustrates particular memory, this disclosure contemplates any suitable memory.

In particular embodiments, storage 106 includes mass storage for data or instructions. As an example and not by way of limitation, storage 106 may include a hard disk drive (HDD), a floppy disk drive, flash memory, an optical disc, a magneto-optical disc, magnetic tape, or a USB drive or a combination of two or more of these. Storage 106 may include removable or non-removable (or fixed) media, where appropriate. Storage 106 may be internal or external to information handling system 100, where appropriate. In particular embodiments, storage 106 is non-volatile, solid-state memory. In particular embodiments, storage 106 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 106 taking any suitable physical form. Storage 106 may include one or more storage control units facilitating communication between processor 102 and storage 106, where appropriate. Where appropriate, storage 106 may include one or more storages 106. Although this disclosure describes and illustrates particular storage, this disclosure contemplates any suitable storage.

In particular embodiments, I/O interface 108 includes hardware, software, or both, providing one or more interfaces for communication between information handling system 100 and one or more I/O devices. Information handling system 100 may include one or more of these I/O devices, where appropriate. One or more of these I/O devices may enable communication between a person and information handling system 100. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 108 for the I/O devices. Where appropriate, I/O interface 108 may include one or more device or software drivers enabling processor 102 to drive one or more of these I/O devices. I/O interface 108 may include one or more I/O interfaces 108, where appropriate. Although this disclosure describes and illustrates a particular I/O interface, this disclosure contemplates any suitable I/O interface.

In particular embodiments, information handling system 100 includes a fan 114. Information handling system 100 may include any number of fans 114 to control and/or regulate airflow for cooling one or more of the components of information handling system 100. Fan 114 cools the information handlings system 100 by driving air circulation over one or more components of information handling system 100. Fan 114 may operate at a specific speed or the speed may be regulated and varied according to one or more criteria. Fan 114 may be regulated locally by the information handling system 100 itself or by another remote information handling system 100 via communication interface 110. In certain embodiments, fan 114 is attached to the chassis 116. While fan 114 is depicted inside information handling system 100, in other embodiments fan 114 may be included outside the chassis 116 or may be attached externally to the chassis 116. In certain embodiments, to create airflow across one or more components of information handling system 100, fan 114 may draw cool air (relative to the air inside the chassis 116 and/or information handling system 100) from outside the information handling system 100 into one end of the chassis 116 and expel warm air out another end of the chassis 116.

As shown in FIG. 1, information handling system 100 and/or various components included therein may be contained within chassis 116. Chassis 116 of information handling system 100 may include any case or enclosure adapted to hold or encompass information handling system 100 or various components of information handling system 100. Chassis 116 may be constructed from steel, aluminum, plastic, glass, any other suitable material, or any combination of these. Certain types of information handling systems may be well suited to particular types of chassis. For example, information handling system 100 may be a server module and may thus be well suited to a rack-type chassis. Chassis 116 may be a rack-type chassis adapted to fit alongside other server modules contained in similar rack-type chassis within a frame or rack adapted to hold multiple server modules. In a rack setup, each server module may be independent or interdependent. Thus, an information handling system 100 may exist on one server module as shown in FIG. 1, or an information handling system may exist across multiple server modules in a rack or many server modules in multiple racks (not shown).

In particular embodiments, communication interface 110 includes hardware, software, or both providing one or more interfaces for communication between information handling system 100 and one or more other information handling systems 100 or one or more networks. The communication interface 110 may communicate via one or more connectors, for example, one or more connectors of a front panel and/or back panel of a chassis 116 enclosure of the information handling system 100. Any one or more suitable transmission protocol and/or standard may be utilized by communication interface 110 including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. As an example and not by way of limitation, communication interface 110 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 110 for it. As an example and not by way of limitation, information handling system 100 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, information handling system 100 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Information handling system 100 may include any suitable communication interface 110 for any of these networks, where appropriate. Communication interface 110 may include one or more communication interfaces 110, where appropriate. Although this disclosure describes and illustrates a particular communication interface, this disclosure contemplates any suitable communication interface.

In particular embodiments, bus 112 includes hardware, software, or both coupling components of information handling system 100 to each other. As an example and not by way of limitation, bus 112 may include a Micro Channel Architecture (MCA) bus, an Accelerated Graphics Port (AGP) or other graphics bus, an Enhanced Industry Standard Architecture (EISA) bus, a Vide Electronics Standards Association (VESA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 112 may include one or more buses 112, where appropriate. Although this disclosure describes and illustrates a particular bus, this disclosure contemplates any suitable bus or interconnect.

Referring now to FIG. 2, selected elements of an embodiment of an environment 200 are illustrated for regulating airflow within the environment 200 to maintain adequate airflow for each information handling system 100 within environment 200 in an efficient manner. Environment 200 comprises one or more racks 210. Any number of racks 210 may be installed in environment 200. For example, rack 210a, rack 210b, through rack 210n may be installed in environment 200 where n represents any number of racks 210. Each rack 210 may include any number of information handling systems 100 (not shown). Each rack 210 may be arranged in any configuration suitable for the environment 200. In certain embodiments, racks 210a-210n may be arranged in multiple columns with multiple racks 210 in each column, touching end-to-end, spaced apart horizontally in rows, or any other configuration suitable for the environment 200 as known by one of ordinary skill in the art or any combination thereof.

Environment 200 may include a central information management console 220. Central information management console 220 may be any type of information handling system 100. In certain embodiments, central information management console 220 is a server or console, such as an integrated Dell Remote Access Control (iDRAC), Dell OpenManage Essentials (OME) and/or Dell OpenManage Power Center (OMPC). In certain embodiments, central information management console 220 is located within the environment 200. In other embodiments, central information management console 220 is located remotely from the environment 200. For example, environment 200 may be a data center located remotely from an administrator or information technology specialist or other user. The central information management console 220 may be located locally at the location of the administrator, information technology specialist or user or the central information management console 220 may be located within the environment 200 and accessed via a remote connection by the administrator, information technology specialist or user.

The central information management console 220 may be coupled to any one or more of the information handling systems 100 within the racks via a communication interface 110. The central information management console 220 may communicate via an interface with the racks 210 and the information handling systems 100 within the racks 210 using any communications protocol, standard, structure, or any combination thereof. For example, the central information management console 220 may communicate wirelessly, via a wired connection or any other way known to one of ordinary skill in the art, or any combination thereof to any one or more of the racks 210 and/or any one or more of the information handling systems 100 within racks 210. For example, a single type of connection and communication may be used or any number of types of connections and communications may be utilized. In particular embodiments, the central information management console 220 may communicate wirelessly via a first wireless protocol with a first information handling system 100 and may communicate wirelessly via a second wireless protocol to a second information handling system 100. In other embodiments, the central information management console 220 may communicate over a wireless connection to a first information handling system 100 and over a wired connection to a second information handling system 100 using any appropriate protocol or standard for the given connection.

Environment 200 may include sensors 230*a*, 230*b* through 230*n*, where n represents any number of sensors for monitoring one or more environmental conditions, system conditions, any other conditions known to one of ordinary skill in the art, or any combination thereof of environment 200. For example, one or more conditions may include, but are not limited to, temperature, airflow, humidity, altitude, pressure or any other conditions known to one of ordinary skill in the art. In particular embodiments, a sensor 230, such as 230*a*, may be included at any location within a rack or may be included within an information handling system 100, a chassis 116, or any combination thereof of a rack 210. Sensor 230 may be between racks 210 such as 230*b* placed between rack 210*b* and 210*n*. A sensor 230 may be placed along any side, top or bottom of a rack 210, such as sensor 230*n*. A sensor may be a tile sensor, a door sensor, any type of sensor known to one of ordinary skill in the art or any combination thereof. In particular embodiments, the flooring of environment 200 may comprise one or more smart tiles where each tile has a sensor for reading and communicating one or more conditions within environment 200 to the central information management console 220. Each sensor 230 may communicate one or more conditions to the central information management console 220.

FIG. 3 is a flowchart for a method of implementing one or more embodiments according to the present disclosure shown generally at 300. At step 310, the central information management console 220 reads the set volumetric airflow limit for each rack 210 in environment 200 or for each group, for each group of racks 210 or group of information handling systems 100. In certain embodiments, the volumetric airflow limit is entered by a user, such as an administrator. In particular embodiments, the volumetric airflow limit is predetermined based on any one or more factors including, but not limited to, one or more settings of one or more sensors 230 (for example, tile sensors or door sensors) where the one or more settings may be default settings, one or more conditions of environment 200, one or more settings of the rack 210, one or more settings of information handling systems 100 within rack 210, cold return air conditioning (CRAC) airflow limits, flowhood or any combination thereof. In other embodiments, the volumetric airflow delivery is read from a sensor, for example, a sensor associated with a tile, a door, a raised floor, a containment system, top of rack cooler, end of row, contained racks (combination of liquid and air cooling), rack door heat exchanger (active or passive) or any combination of sensors thereof. The central information management console 220 may store the volumetric airflow limit in memory, for example, in memory 104 or storage 106.

At step 320, the central information management console 220 reads one or more balancing options associated with each rack 210. For example, the one or more balancing options for a rack 210 may be set via the central information management console 220. The balancing options may be read at selected intervals, real-time, whenever a change is made, at the expiration of a timer or interrupt, or by any other manner known to one of ordinary skill in the art. In particular embodiments, the balancing options are requested or received automatically without any user intervention. Balancing options may include, but are not limited to, any one or more of volumetric airflow sensitivity, equal allocation of volumetric airflow limits (for example, volumetric airflow limits for each information handling system 100 within a rack 210), priority based on configurable power range (for example, an in-system characterization (ISC) range run average power limit (RAPL) limitation), volumetric airflow scaling based on type of workload at the information handling system 100, and allocation of volumetric airflow based, at least in part, on a priority setting for information handling system 100.

At step 330, one or more sensor readings from one or more sensors 230 that for sensing one or more conditions of environment 200, one or more metrics or any combination thereof are received or requested by the central information management console 220. The central information management console 220 may request the one or more sensor readings, may receive the one or more sensors readings automatically or in real-time, may request or receive the one or more sensor readings at a timed interval or upon an interrupt, or by any other manner known to one of ordinary skill in the art. In particular embodiments, the one or more conditions may include, but are not limited to, a volumetric airflow value for a given information handling system 100 within a rack 210, a temperature measurement, a humidity measurement, a fan speed value, any other condition known to one of ordinary skill in the art for a rack 210 or an information handling system 100 or any combination thereof. For example, sensor 230 may communicate one or more readings associated with one or more conditions of a rack 210, an information handling system 100, or any combination thereof. One or more metrics from the rack 210 or an information handling system 100 within a rack 210 may also be received by the central information management console 220. The one or more metrics may include, but are not limited to, number of information handling systems 100 within a rack 210, priority setting for an information handling system 100 or a rack 210 or any combination thereof, configurable power range for an information handling system 100 or a rack 210 or any combination thereof, type of workload or any other metric known to one of ordinary skill in the art.

At step 340, the balancing option to use for control of airflow within environment 200 is determined. The determination is based, at least in part, on the received one or more balancing options at step 320. In particular embodiments, the central information management console 220 may read from a stored location a value received at step 320. In particular embodiments, the central information management console 220 may request real-time the one or more balancing options of a rack 210, an information handling system 100 or any combination thereof. In particular embodiments, the central information management console 220 may request the one or more balancing options at a timed interval, may receive alerts when any changes have been made to any of the automated balancing conditions, or may receive the one or more balancing options in any way and at any time period known to one of ordinary skill in the art. In particular embodiments, one or more balancing options are selected. In such embodiments, it is determined which of the selected one or more balancing options require the least volumetric airflow delivery to the one or more racks 210. For example, in particular embodiments, when one or more balancing options are selected, the central information management console implements the selected balancing option that ensures that selected options are optimized for thermal compliance based on a predetermined criteria, for example, a user preference.

At step 350, the one or more sensor readings, or the one or more metrics or any combination thereof are processed. In one particular embodiment, the determined balancing option from step 340 is the volumetric airflow sensitivity option. The volumetric airflow sensitivity option is an impact to fan power consumption for a fan 114 for every extra unit volume of airflow delivered by an associated information handling system 100, or the slope of the volumetric airflow versus fan power curve for the information handling system 100. The central information management console 220 may receive a volumetric airflow sensitivity metric, for example, CFM reading or cubic meter per second, from a sensor 230 for an information handling system 100 or a rack 210 or any combination thereof. For example, a first information handling system 100 within a rack 210 may have a lower volumetric airflow sensitivity metric than a second information handling system 100 within the same rack 210 or a different rack 210. For example, a first information handling system 100 may have a 1 Watt incremental fan power that delivers only 1.26 CFM of volumetric airflow while for the same 1 Watt incremental fan power a second information handling system 100 may deliver 1.83 CFM of volumetric airflow. The second information handling system 100 may be determined to have more priority by the central information management console 220 since for each Watt consumed, more CFM of volumetric airflow is realized. At step 350, the central information management console 220 will instruct the second information handling system 100 to increase power to the associated fan 114 whereas the first information handling system 100 will be instructed to decrease or maintain the same level of power to the associated fan 114. Such processing and subsequent instructions may be given for each information handling system 100 of each rack 210 in an environment 200. In particular embodiments, a plurality of information handling systems 100 of rack 210 have the same priority. In such embodiments, the deficit of volumetric airflow or the excess of volumetric airflow associated with the rack 210 is distributed equally across each of the plurality of information handling systems 100. In particular embodiments, such processing is performed at the rack-level such that instructions for increasing the level of power of any given fan 114 is provided based, at least in part, on the total volumetric airflow for a rack 210. For example, in an environment 200 with multiple racks 210, the rack 210 with the lowest volumetric airflow sensitivity metric (for example, higher CFM per Watt) may be allocated the most power for a given fan 114 as more cooling per unit of power (for example, per Watt) is obtained. In this way, volumetric airflow is increased at the least amount of cost to power consumption and processing power for a given information handling system 100.

In a particular embodiment, the information handling system 100 within a rack 210 may also communicate to the central information management console 220 a performance metric where the performance metric is a metric of performance impact as a function of volumetric airflow for an associated fan 114. The information handling system 100 with the least performance impact per volumetric airflow may be regulated more by the central information management console 220 to optimize overall rack level throughput. The performance metric may be generated through development characterizations or run-time characterization. For example, run system testing may be performed at a given rack 210 and such testing may provide the impact on performance as a metric (for example, performance benchmark per Watt). Any generic performance metric may utilized as the performance metric such as compute usage per second (CUPS) (CUPS/CFM) or CUPS/cubic meter per second. The CFM/Watt would, generally, be proportional to CFM/CUPS or another performance metric known to one of ordinary skill in the art. For example, a rack 210 may have a mix of different types of information handling systems 100. To process the received metric in step 350, a priority is determined for each information handling system 100 within a rack 210. For example, the rack 210 may include any number of different types of information handling systems 100. In one embodiment, the rack 210 includes three information handling systems 100 with metrics as specified in Table 1. While Table 1 illustrates certain metrics expressed using a specified unit of measurement, the present disclosure contemplates utilization of any other appropriate unit of measurement. At step 350, the central information management console 220 will prioritize IHS 1 over IHS 3 and IHS 2 over IHS 1 and IHS 3 since limiting airflow on IHS 2 will translate into the biggest performance hit. In one or more embodiments, the performance metric (for example, CFM/Watt) is determined dynamically by the information handling system 100 and may be a metric that is received by the central information handling system 100 in real time.

TABLE 1

| Information Handling System | CFM/Watt | Max CFM |
| --- | --- | --- |
| IHS 1 | 1/7 | 140 |
| IHS 2 | 1/10 | 90 |
| IHS 3 | 1/5 | 100 |

In another embodiment, at step 350 the balancing option read at step 320 is priority based on a configurable power range (such as ISC range RAPL limitation). Volumetric airflow limitations for any one or more information handling system of rack 210 may be determined by the central information management console 220 using power limits for each information handling system 100 along energy balance principles and received real time system state and environment values. Each information handling system 100 may be allocated or set a priority, based at least in part, on the configurable power range associated with of the information handling systems 100. The information handling system 100 may allocate the highest priority (permit the greatest amount of volumetric airflow) to the information handling system with the lowest configurable power range. A larger power capping range results in control of more power and the ability to allocated less airflow compared to a system that has limited configurable power where power cannot be capped as much. The information handling systems 100 are then allocated volumetric airflow based, at least in part on, the allocated priority. For example, a first information handling system 100 within a rack 210 may have a lower configurable power limit (for example, ISC upper limit) of 535 Watts and an upper configurable power limit (for example, ISC lower limit) of 650 Watts due to a high I/O configuration that limits a potential power capping window. A second information handling system 100 within the rack 210 may have a lower configurable power limit of 588 Watts and an upper configurable power limit of 836 Watts which allows greater room for power capping. The central information management console 220 may then give the first information handling system 100 higher priority due to the power capping limitation. The central information management console 220 at step 350 may process any received or requested readings and metrics by determining the configurable power limits and power capping for each information handling system 100 within each rack 210 and then may instruct or provide that the information handling system 100 with the lowest power capping window be given priority with respect to higher volumetric airflow. For example, the central information management console 220 may provide or instruct that more power be allocated to operate the fan 114 associated with the first information handling system 100 and that power be decreased or maintained at a current level for the fan 114 associated with the second information handling system 100.

In another embodiment, at step 350 the balancing option read at step 320 is equal allocation of airflow limits for each information handling system 100 with a rack 210. The central information management console 220 at step 350 processes the readings and/or metrics received to define rack level limit to volumetric airflow for each rack 210 of environment 200. In one embodiment, a volumetric airflow limit may be received at step 330 from a rack 210, an information handling system 100 of rack 210 or any combination thereof. In another embodiment, a volumetric airflow limit is set at the central information management console 220. The total available volumetric airflow is allocated across each information handling system 100 within an associated rack 210 where the total available volumetric airflow is capped at the volumetric airflow limit. Table 2 at column "Ration (CFM)" illustrates this equal allocation or rationing of volumetric airflow for a given volumetric airflow limit of 1000 CFM. While Table 2 illustrates certain metrics expressed using a specified unit of measurement, the present disclosure contemplates utilization of any other appropriate unit of measurement.

TABLE 2

| Information Handling System | Ration (CFM) | First Polling Airflow (CFM) | Second Polling Airflow (CFM) | Equal Distribution (CFM) |
| --- | --- | --- | --- | --- |
| IHS 1 | 100 | 40 | 110 | 96 |
| IHS 2 | 100 | 75 | 120 | 106 |
| IHS 3 | 100 | 125 | 95 | 81 |
| IHS 4 | 100 | 115 | 90 | 76 |
| IHS 5 | 100 | 72 | 105 | 91 |
| IHS 6 | 100 | 65 | 120 | 106 |
| IHS 7 | 100 | 85 | 120 | 106 |
| IHS 8 | 100 | 75 | 150 | 136 |
| IHS 9 | 100 | 25 | 105 | 91 |
| IHS 10 | 100 | 135 | 125 | 111 |
| Total | 1000 | 812 | 1140 | 1000 |

Based on the consumption by each information handling system 100 (for example, IHS 1 through IHS 10), an aggregation is performed and if consumption is less than the volumetric airflow limit, all information handling systems 100 (for example, IHS 1 through IHS 10) get the requested or needed volumetric airflow. In one embodiment, at step 330 a first polling is performed and a volumetric airflow value for one or more information handling systems 100 of a rack 210 is received by the central information management console 220. During processing at step 350, each volumetric airflow value is aggregated. Because the aggregate of the volumetric airflow values is below the volumetric airflow limit, the central information management console 220 provides or instructs that the current volumetric airflow values be provided or maintained. For example, Table 2 at column "First Polling Airflow (CFM) illustrates that while IHS 3, IHS 4, and IHS 10 require more than the equally distributed ration of 100 CFM per information handling system 100, the total required volumetric airflow CFM for the rack 210 is under the airflow limit of 1000 CFM. In such embodiments, the central information management console 220 at step 350 permits each information handling system 100 of rack 210 to receive the requested power for each associated fan 114 as the aggregate of the volumetric airflow values of rack 210 is within the predetermined, requested, or received volumetric airflow limit.

In another embodiment, the total required volumetric airflow for the rack 210 exceeds the volumetric airflow limit, for example, exceeds 1000 CFM. Table 2 at column "Second Polling Airflow (CFM)" illustrates that at a subsequent point in time from the first polling of the rack 210 and/or of each information handling system 100 within rack 210 the requested or consumed volumetric airflow exceeds the volumetric airflow limit of 1000 for the rack 210 by 140 CFM. In such embodiments, at step 350, the central information management console 220 determines the difference between the volumetric airflow limit and the actual aggregated volumetric airflow value of each of the information handling systems 100 (for example, (total second polling airflow (CFM) for each IHS 1 through IHS 10) minus airflow limit). This difference is then distributed equally across each information handling system 100 (for example, IHS 1 through IHS 10) such that the volumetric airflow of each information handling system is decreased by the same amount to bring the aggregate volumetric airflow under the volumetric airflow limit. For example, as illustrated in Table 2 at column "Equal Distribution (CFM)" the volumetric airflow for each information handling system 100 IHS 1 through IHS 10 is reduced by 14 CFM which is ((total second polling airflow (CFM))−(airflow limit))/(number of information handling systems 100 of rack 210) (for example, (1140−1000)/10)= 14). The central information management console 220 provides or instructs that the power supplied to each associated fan 114 of each information handling system 100 decrease such that the corresponding fan speed is decreased so that the volumetric airflow limit for the rack 210 is not exceeded by the aggregate or total of the requested or received volumetric airflow values. Once the volumetric airflow limit to an information handling system 100 within a rack 210 is determined, requested or received, it may be determined that the information handling system 100 requires more volumetric airflow than the volumetric airflow limit will permit so that each information handling system 100 performs at the current power and processing levels. As the central information management console 220 will not permit the volumetric airflow to the information handling system 100 to exceed the volumetric airflow limit, the volumetric airflow to each information handling system 100 will be limited and then either the central information management console 220 will instruct the information handling system 100 to operate within certain power and processing constraints so as to comply with thermal limitations, the information handling system 100 will detect that it is under volumetric airflow constraints and will on its own constrain power and processing to stay within thermal limitations, or any other manner of power capping known to one of ordinary skill in the art will be utilized to constrain the power and processing of information handling system 100 to maintain operation of the information handling system 100 within thermal limitations. In certain embodiments, each information handling system 100 includes one or more power capping policies. In other embodiments, the central information management console 220 maintains one or more power capping policies for any one or more information handling systems 100 within environment 200.

In another embodiment, at step 350 the central information management console 220 processes the received metrics and/or readings for the balancing option read at step 320 of allocation of volumetric airflow based on a priority setting for the information handling system 100. In particular embodiments, a group of information handling systems 100 is assigned a priority level based, at least in part, on one or more criteria including, but not limited to, criticality of performance (for example, workload is of high importance), workload (for example, volume of workload), premium service (for example, customer pays more for increased performance), any other criteria known to one of ordinary skill in the art or any combination thereof. For example, Table 3 at column "Priority Setting" illustrates a priority setting for information handling systems 100 (IHS 1 through IHS 10) for a rack 210 given volumetric airflow limit of 1000 CFM (a ration of 100 CFM per information handling system 100). While Table 3 illustrates certain metrics expressed using a specified unit of measurement, the present disclosure contemplates utilization of any other appropriate unit of measurement.

TABLE 3

| Information Handling System | Priority Setting | Ration (CFM) | First Polling Airflow (CFM) | Second Polling Airflow (CFM) | Allocation (CFM) |
|---|---|---|---|---|---|
| IHS 1 | 8 | 100 | 40 | 40 | 40 |
| IHS 2 | 8 | 100 | 75 | 80 | 80 |
| IHS 3 | 8 | 100 | 125 | 145 | 145 |
| IHS 4 | 2 | 100 | 115 | 135 | 95 |
| IHS 5 | 2 | 100 | 72 | 135 | 95 |
| IHS 6 | 2 | 100 | 65 | 125 | 95 |
| IHS 7 | 6 | 100 | 85 | 80 | 80 |
| IHS 8 | 6 | 100 | 75 | 95 | 95 |
| IHS 9 | 5 | 100 | 25 | 125 | 125 |
| IHS 10 | 5 | 100 | 135 | 150 | 150 |
| Total | | 1000 | 812 | 1110 | 1000 |

In one embodiment, the information handling systems 100 of a rack 210 are placed into one or more groups. For example, as illustrated in Table 3 the information handling systems 100 of a rack 210 are grouped according to the following: group 1 comprising IHS 1 through IHS 3; group 2 comprising IHS 4 through IHS 6, group 3 comprising IHS 7 and IHS 8; and group 4 comprising IHS 9 and IHS 10. Each group has an assigned priority as illustrated in Table 3 at column "Priority Setting" where higher values have a higher priority. For example, group 1 with a priority setting of 8 has the highest priority whereas group 2 with a priority setting of 2 has the lowest priority. In another embodiment, each information handling system 100 is assigned an individual priority setting and that priority setting may be read as a metric at step 330. In another embodiment, one or more information handling systems 100 of the rack 210 may be grouped and given a priority setting while one or more information handling systems 100 of the rack 210 are given individual priority settings.

A first poll of the information handling systems 100 of rack 210, results in receiving volumetric airflow values at step 330 that aggregate or total to less than the volumetric airflow limit for rack 210 read at step 310. The central information management console 220 at step 350 may instruct or provide that the current power supplied to each associated fan 114 be maintained. For example, as illustrated in Table 3, a first poll results in a total volumetric airflow of 812 CFM which is less than the volumetric airflow limit of 1000 CFM read at step 310. Because the airflow limit read at step 310 is not reached, IHS 3, IHS 4 and IHS 10 are permitted to operate at a volumetric airflow greater than the ration value of 100 CFM. A second poll of the information handling systems 100 of the rack 210, results in receiving volumetric airflow values at step 330 that aggregate or total to greater than the volumetric airflow limit for rack 210 read at step 310. The central information management console 220 at step 350 may reduce power to at least one group of information handling systems 100 or to one or more individual information handling systems 100. For example, in one embodiment, the central information management console 220 at step 350 instructs or provides that the power to each associated fan 114 of the information handling systems 100 of group 2 is reduced. As illustrated in Table 3 at column "Allocation (CFM)", the allocation of volumetric airflow is reduced to IHS 4, IHS 5 and IHS 6 of group 2 (the lowest priority group) by 40 CFM, 40 CFM and 30 CFM, respectively, by decreasing power to each associated fan 114. Because IHS 4, IHS 5 and IHS 6 receive less than the required amount of volumetric airflow, the central information management console 220 determines the power consumption that each of IHS 4, IHS 5 and IHS 6 can support at 95 CFM and then sets the power capping policies on each of IHS 4, IHS 5, and IHS 6 to limit the power consumption to 95 CFM so that the volumetric airflow will provide sufficient cooling for the respective power consumption.

In another embodiment, at step 350 the balancing option read at step 320 is volumetric scaling based on type of workload. In one embodiment, the type of workload associated with each information handling system 100 within a rack 210 is received at step 330. At step 350 the central information management console 220 processes the received type of workload metrics and instructs or provides that a first one or more information handling systems 100 within rack 210 receives more power to each associated fan 114 (or allocated greater volumetric airflow) than a second one or more other information handling systems 100 within the rack 210 based, at least in part on the first one or more information handling systems 100 having a type of workload ranked higher than the type of workload associated with the second one or more information handling systems 100. Some types of workload require processing that may increase overall or component-level temperatures of an information handling system 100 within a rack 210. These types of workload require greater volumetric airflow than other types of workload to prevent excessive temperatures (or for example, to prevent exceeding thermal limitations) which may result in poor performance of a given information handling system 100. For example, an information handling system 100 within rack 210 may have a type of workload that requires high central processing unit (CPU) cycles while another information handling system 100 within the rack 210 may have a type of workload that requires a high storage workload. The central information management console 220 at step 350 may allocate more volumetric airflow (increase power to the associated fan 114 to increase fan speed) to the information handling system 100 with high CPU cycles to maintain or increase performance.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (for example, one or more of blocks, modules, elements, components or processors) for performing one or more functions or operations. In one aspect, such an item may be an apparatus, hardware, or a portion thereof. In one example, an item may have a structure in the form of, for example, an instruction(s) encoded or stored on a machine-readable medium, on another device, or on a portion thereof. An instruction(s) may be software, an application(s), a subroutine(s), or a portion thereof. The instructions(s) may be for performing the function(s) or operation(s). The instruction(s) may be executable by one or more processors to perform the function(s) or operation(s). One or more processors may execute the instruction(s) by, for example, transferring or copying and instructions into an executable memory space and executing the instructions. In one example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (for example, a DSP, an ASIC, an FPGA, etc.), as a portion(s) of any of the foregoing, or as a combination(s) of any of the foregoing. Those skilled in the art will recognize how to implement the instructions, circuits, and processing systems.

In one aspect of the disclosure, when actions or functions (for example, hooking, modifying, intercepting, redirecting, determining, traversing, obtaining, creating, operating, deleting, removing, receiving, providing, generating, converting, displaying, notifying, accepting, selecting, controlling, transmitting, reporting, sending, or any other action or function) are described as being performed by an item (for example, one or more of blocks, modules, elements, components or processors), it is understood that such actions or functions may be performed, for example, by the item directly. In another example, when an item is described as performing an action, the item may be understood to perform the action indirectly, for example, by facilitating such an action (for example, assisting, allowing, enabling, causing, or providing for, such action to occur; or performing a portion of such an action). For example, determining can refer to facilitating determination, attaching can refer to facilitating attaching, and receiving can refer to facilitating receiving. In one aspect, performing an action may refer to performing a portion of the action (for example, performing a beginning part of the action, performing an end part of the action, or performing a middle portion of the action).

A reference to an element in the singular is not intended to mean "one and only one" unless specifically so stated, but rather "one or more." For example, a client may refer to one or more clients, a server may refer to one or more servers, an operation may refer to one or more operations, and a signal, message, or communication may refer to one or more signals, messages, or communications.

Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled or communicatively coupled.

Various items may be arranged differently (for example, arranged in a different order, or partitioned in a different way) all without departing from the scope of the subject technology. In one aspect of the disclosure, the elements recited in the accompanying claims may be performed by one or more modules or sub-modules. For example, a local link creation module and a local link deletion module may be combined into one module.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. § 101, 102, or 103, nor should they be interpreted in such a way. Any unintended embracement of such subject matter is hereby disclaimed.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method for regulating volumetric airflow in an environment, comprising:
    receiving a volumetric airflow limit for a rack within the environment, wherein the rack comprises one or more information handling systems;
    receiving one or more balancing options, wherein the one or more balancing options comprise at least one of volumetric airflow sensitivity, equal allocation of volumetric airflow limits, priority based, at least in part, on configurable power range, volumetric airflow scaling based on type of workload, and allocation of volumetric airflow based on a priority setting;
    receiving one or more sensor readings from one or more sensors associated with the rack;
    receiving one or more metrics from the one or more information handling systems, wherein a fan is associated with each of the one or more information handling systems;
    prioritizing each of the one or more information handling systems based, at least in part, on the received one or more balancing options; and
    balancing volumetric airflow automatically for the rack, wherein the balancing is based, at least in part, on the prioritization and the received one or more balancing options, and wherein the balancing maintains volumetric airflow within the rack within the volumetric airflow limit.

2. The method of claim 1, further comprising:
    wherein the one or more balancing options comprise volumetric airflow sensitivity;
    receiving a volumetric airflow sensitivity reading from the one or more sensors for the one or more information handling systems;
    prioritizing the one or more information handling systems based, at least in part, on the volumetric airflow sensitivity reading associated with each of the one or more information handling systems;
    determining which of the one or more information handling systems has the highest priority; and
    balancing volumetric airflow to the rack by sending one or more instructions to increase power to a fan associated with an information handling system determined to have the highest priority, wherein the increase in power to the fan associated with an information handling system determined to have the highest priority is balanced across the one or more information handling systems so that overall airflow to the rack does not exceed the volumetric airflow limit.

3. The method of claim 1, further comprising:
    wherein the one or more balancing options comprise allocation of volumetric airflow limits;
    receiving a volumetric airflow value for each of the one or more information handling systems;
    aggregating the received volumetric airflow value associated with each of the one or more information handling systems as a total volumetric airflow;
    determining a difference between the volumetric airflow limit and the total volumetric airflow; and
    allocating equally the difference across each of the one or more information handling systems, wherein allocating the difference comprises:
        reducing power supplied to each fan associated with the one or more information handling systems; and
        instructing the one or more information handling systems to implement one or more associated power capping policies.

4. The method of claim 1, further comprising:
    wherein the one or more balancing options comprise priority based on configurable power range;
    determining a configurable power range for each of the one or more information handling systems;
    allocating a configurable power based priority for each of the one or more information handling systems based, at least in part, on the configurable power range associated with each of the one or more information handling systems; and
    allocating volumetric airflow based, at least in part, on the allocated configurable power based priority.

5. The method of claim 1, further comprising:
    wherein the one or more balancing options comprise volumetric scaling based on type of workload;

receiving a type of workload associated with each of the one or more information handling systems;
ranking each type of workload; and
allocating a greater volumetric airflow to at least a first one of the one or more information handling systems than at least a second one of the one or more information handling systems based, at least in part, on the ranking of the type of workload associated with each of the at least a first one of the one or more information handling systems and the at least a second one of the one or more information handling systems.

6. The method of claim 1, further comprising:
wherein the one or more balancing options comprise allocation of volumetric airflow based on a priority setting;
assigning the one or more information handling systems a priority level, wherein the priority level is based, at least in part, on one or more criteria;
grouping the one or more information handling systems based on the priority level associated with each of the one or more information handling systems;
receiving a volumetric airflow value for each of the one or more information handling systems;
aggregating the received volumetric airflow value associated with each of the one or more information handling systems as a total volumetric airflow;
determining a difference between the volumetric airflow limit and the total volumetric airflow;
reducing power to each fan associated with each information handling system in a lower priority group; and
implementing one or more power capping policies at the each information handling system in the lower priority group.

7. The method of claim 1, wherein power to a fan associated with a lower priority information handling system is decreased when power is increased to a fan associated with an information handling system determined to have the highest priority to maintain volumetric airflow across the rack that does not exceed the volumetric airflow limit.

8. A system comprising:
a first information handling system;
one or more central processing units for processing information of the first information handling system;
a memory of the first information handling system communicatively coupled to the one or more central processing units; and
one or more modules that comprise instructions stored in the memory, the instructions, when executed by the one or more processing units, operable to perform operations comprising:
receiving a volumetric airflow limit for a rack within the environment, wherein the rack comprises one or more information handling systems;
receiving one or more balancing options, wherein the one or more balancing options comprise at least one of volumetric airflow sensitivity, equal allocation of volumetric airflow limits, priority based on configurable power range, volumetric airflow scaling based on type of workload, and allocation of volumetric airflow based on a priority setting;
receiving one or more sensor readings from one or more sensors associated with the rack;
receiving one or more metrics from the one or more information handling systems, wherein a fan is associated with each of the one or more information handling systems;
prioritizing each of the one or more information handling systems based, at least in part, on the received one or more balancing options; and
balancing volumetric airflow automatically for the rack, wherein the balancing is based, at least in part, on the prioritization and the received one or more balancing options, and wherein the balancing maintains volumetric airflow within the rack within the volumetric airflow limit.

9. The system of claim 8, the instructions further operable to perform operations comprising:
wherein the one or more balancing options comprise volumetric airflow sensitivity;
receiving a volumetric airflow sensitivity reading from the one or more sensors for the one or more information handling systems;
prioritizing the one or more information handling systems based, at least in part, on the volumetric airflow sensitivity reading associated with each of the one or more information handling systems;
determining which of the one or more information handling systems has the highest priority; and
balancing volumetric airflow to the rack by sending one or more instructions to increase power to a fan associated with an information handling system determined to have the highest priority, wherein the increase in power to the fan associated with an information handling system determined to have the highest priority is balanced across the one or more information handling systems so that overall airflow to the rack does not exceed the volumetric airflow limit.

10. The system of claim 8, wherein the instructions further operable to perform operations comprising:
wherein the one or more balancing options comprise allocation of volumetric airflow limits;
receiving a volumetric airflow value for each of the one or more information handling systems;
aggregating the received volumetric airflow value associated with each of the one or more information handling systems as a total volumetric airflow;
determining a difference between the volumetric airflow limit and the total volumetric airflow; and
allocating equally the difference across each of the one or more information handling systems, wherein allocating the difference comprises:
reducing power supplied to each fan associated with the one or more information handling systems; and
instructing the one or more information handling systems to implement one or more associated power capping policies.

11. The system of claim 8, wherein the instructions further operable to perform operations comprising:
wherein the one or more balancing options comprise priority based on configurable power range;
determining a configurable power range for each of the one or more information handling systems;
allocating an configurable power based priority for each of the one or more information handling systems based, at least in part, on the configurable power range associated with each of the one or more information handling systems; and
allocating volumetric airflow based, at least in part, on the allocated configurable power based priority.

12. The system of claim 8, wherein the instructions further operable to perform operations comprising:

wherein the one or more balancing options comprise volumetric scaling based on type of workload;
receiving a type of workload associated with each of the one or more information handling systems;
ranking each type of workload; and
allocating a greater volumetric airflow to at least a first one of the one or more information handling systems than at least a second one of the one or more information handling systems based, at least in part, on the ranking of the type of workload associated with each of the at least a first one of the one or more information handling systems and the at least a second one of the one or more information handling systems.

13. The system of claim 8, wherein the instructions further operable to perform operations comprising:
wherein the one or more balancing options comprise allocation of volumetric airflow based on a priority setting;
assigning the one or more information handling systems a priority level, wherein the priority level is based, at least in part, on one or more criteria;
grouping the one or more information handling systems based on the priority level associated with each of the one or more information handling systems;
receiving a volumetric airflow value for each of the one or more information handling systems;
aggregating the received volumetric airflow value associated with each of the one or more information handling systems as a total volumetric airflow;
determining a difference between the volumetric airflow limit and the total volumetric airflow;
reducing power to each fan associated with each information handling system in a lower priority group; and
implementing one or more power capping policies at the each information handling system in the lower priority group.

14. The system of claim 8, wherein power to a fan associated with a lower priority information handling system is decreased when power is increased to a fan associated with an information handling system determined to have the highest priority to maintain volumetric airflow across the rack that does not exceed the volumetric airflow limit.

15. One or more computer-readable non-transitory storage media embodying software operable when executed by one or more computer systems to:
receive a volumetric airflow limit for a rack within the environment, wherein the rack comprises one or more information handling systems;
receive one or more balancing options, wherein the one or more balancing options comprise at least one of volumetric airflow sensitivity, equal allocation of airflow limits, priority based on configurable power range, volumetric airflow scaling based on type of workload, and allocation of airflow based on a priority setting;
receive one or more sensor readings from one or more sensors associated with the rack;
receive one or more metrics from the one or more information handling systems, wherein a fan is associated with each of the one or more information handling systems;
prioritize each of the one or more information handling systems based, at least in part, on the received one or more balancing options; and
balance volumetric airflow automatically for the rack, wherein the balancing is based, at least in part, on the prioritization and the received one or more balancing options, and wherein the balancing maintains volumetric airflow within the rack within the volumetric airflow limit.

16. The media of claim 15, the software is further operable when executed to:
wherein the one or more balancing options comprise volumetric airflow sensitivity;
receive a volumetric airflow sensitivity reading from the one or more sensors for the one or more information handling systems;
prioritize the one or more information handling systems based, at least in part, on the volumetric airflow sensitivity reading associated with each of the one or more information handling systems;
determine which of the one or more information handling systems has the highest priority; and
balance volumetric airflow to the rack by sending one or more instructions to increase power to a fan associated with an information handling system determined to have the highest priority, wherein the increase in power to the fan associated with an information handling system determined to have the highest priority is balanced across the one or more information handling systems so that overall airflow to the rack does not exceed the volumetric airflow limit.

17. The media of claim 15, wherein the software is further operable when executed to:
wherein the one or more balancing options comprise equal allocation of volumetric airflow limits;
receive a volumetric airflow value for each of the one or more information handling systems;
aggregate the received volumetric airflow value associated with each of the one or more information handling systems as a total volumetric airflow;
determine a difference between the volumetric airflow limit and the total volumetric airflow; and
allocate equally the difference across each of the one or more information handling systems, wherein allocating the difference comprises:
reducing power supplied to each fan associated with the one or more information handling systems; and
instructing the one or more information handling systems to implement one or more associated power capping policies.

18. The media of claim 15, wherein the software is further operable when executed to:
wherein the one or more balancing options comprise priority based on configurable power range;
determine an configurable power range for each of the one or more information handling systems;
allocate an configurable power based priority for each of the one or more information handling systems based, at least in part, on the configurable power range associated with each of the one or more information handling systems; and
allocate volumetric airflow based, at least in part, on the allocated configurable power based priority.

19. The media of claim 15, wherein the software is further operable when executed to:
wherein the one or more balancing options comprise volumetric scaling based on type of workload;
receive a type of workload associated with each of the one or more information handling systems;
rank each type of workload; and
allocate a greater volumetric airflow to at least a first one of the one or more information handling systems than at least a second one of the one or more information handling systems based, at least in part, on the ranking of the type of workload associated with each of the at least a first one of the one or more information handling systems and the at least a second one of the one or more information handling systems.

20. The media of claim 15, wherein then the software is further operable when executed to:
wherein the one or more balancing options comprise allocation of volumetric airflow based on a priority setting;
assign the one or more information handling systems a priority level, wherein the priority level is based, at least in part, on one or more criteria;
group the one or more information handling systems based on the priority level associated with each of the one or more information handling systems;
receive a volumetric airflow value for each of the one or more information handling systems;
aggregate the received volumetric airflow value associated with each of the one or more information handling systems as a total volumetric airflow;
determine a difference between the volumetric airflow limit and the total volumetric airflow;
reduce power to each fan associated with each information handling system in a lower priority group; and
implement one or more power capping policies at the each information handling system in the lower priority group.

* * * * *